United States Patent [19]
Baji et al.

[11] 4,407,010
[45] Sep. 27, 1983

[54] SOLID STATE IMAGE PICKUP DEVICE

[75] Inventors: Toru Baji, Kokubunji; Toshihisa Tsukada; Norio Koike, both of Tokyo; Toshiyuki Akiyama, Hachioji; Iwao Takemoto, Hinodemachi; Shigeru Shimada, Houya; Chushirou Kusano, Hachioji; Shinya Ohba, Kokubunji; Haruo Matsumaru, Hinodemachi, all of Japan

[73] Assignee: Hitachi, Ltd., Tokyo, Japan

[21] Appl. No.: 290,570

[22] Filed: Aug. 6, 1981

[30] Foreign Application Priority Data

Aug. 20, 1980 [JP] Japan .................. 55-113511

[51] Int. Cl.³ ............................... H04N 3/14
[52] U.S. Cl. ........................... 358/213; 250/211 J; 250/211 R; 357/45; 358/167
[58] Field of Search .............. 357/45; 358/166, 167, 358/212, 213; 250/211 J, 211 R

[56] References Cited

U.S. PATENT DOCUMENTS 3,715,485 2/1973 Weimer ...................... 358/213

Primary Examiner—Robert L. Richardson
Attorney, Agent, or Firm—Antonelli, Terry & Wands

[57] ABSTRACT

A solid state image pickup device having a plurality of solid state elements in a two-dimensional array so as to form picture cells. Each solid state element includes a photoelectric converting element and a switching field effect transistor to permit scanning of the elements by scanners. To counteract noise and blooming, a second field effect transistor acting as an amplifier is connected between the photoelectric converting element and the switching field effect transistor. A third field effect transistor is coupled to the photoelectric converting element for resetting the same.

10 Claims, 22 Drawing Figures

SOLID STATE IMAGE PICKUP DEVICE

BACKGROUND OF THE INVENTION

1. Field of the Invention

The present invention relates to a solid state image pickup device.

2. Description of the Prior Art

A predetermined number of photoelectric converting elements, each of which is constructed of a photodiode and a MOS transistor using the photodiode as its source portion, are arranged to respectively correspond to picture cells, and the photoelectric converting elements, which are arranged in a row vertically of an image pickup frame, are generalized by a signal line and are connected each row with an output terminal through a switching MOS transistor. There are additionally provided horizontal and vertical scanning circuits which are constructed of MOS shift registers. The horizontal scanning circuit controls the gates of the MOS transistors through a signal line thereby to perform the horizontal scanning operation. The vertical scanning circuit generalizes and directly controls the gates of the MOS transistors of the respective photoelectric converting elements, which are arranged in a line horizontally of the image pickup frame, for each line thereby to perform the vertical scanning operation. The following description is directed to an n-channel type device using electrons as its signal charge, but a completely similar description can be applied to a p-channel type device using positive holes as its signal charge by inverting the conduction type and the polarity.

The electrons generated by a light are stored in the junction capacitors of the photodiodes. Upon the reading operation, the MOS transistors are rendered conductive through the signal lines by the positive scanning pulses which are generated by the vertical scanning circuit, and the MOS transistors are consecutively rendered conductive through the signal lines by the positive scanning pulses which are generated by the horizontal scanning circuit. Thus for the time period after the once scanning operation and before the subsequent scanning operation, the charges, which have been converted by the photodiodes from the light incident upon the picture cells and which have been stored in the junction capacitors of the photodiodes, are consecutively read out as signal charges.

In the image pickup device to be described, a parasitic capacitance exists between the gate and drain of the switching MOS transistor. Through that capacitance, the scanning pulses from the scanning circuits appear in the form of a spike noise. The intensity of this spike noise disperses due to irregularities in the threshold voltages of the transistors and in the capacitances. This results in establishment of the noise which has such a pattern as is fixed horizontally of the image to be picked up. In the solid state image pickup device or the image pickup tube, since the capacitance to appear at the output terminal generally has a value as high as about 10 pF, the high-frequency component of the image information leaks through that capacitance to the substrate. In order to compensate for this leakage, it is necessary to raise the high-frequency gain of a preamplifier of a camera to be connected with the output terminal of the image pickup device. On the other hand, since an element to be used as the input terminal of the preamplifier, e.g., a junction field effect transistor generates a white noise having an intensity distribution having no relationship with the frequency, the high-frequency noise is highly amplified, if the high-frequency gain of the preamplifier is raised, so that the S/N ratio of the device is deteriorated.

The image pickup device has an additional major problem. This is the phenomenon of blooming, in which a vertical white band appears from the brighter portion of the image pickup frame when a strongly lit image is picked up.

SUMMARY OF THE INVENTION

According to a feature of the present invention, there is provided a solid state image pickup device, in which a photoelectric converting element unit is not connected directly with a switching MOS transistor, namely, in which the photoelectric converting element unit is connected indirectly with the switching MOS transistor through an amplifying MOS transistor.

According to a more concrete feature of the present invention, there is provided a solid state image pickup device comprising a group of photoelectric converting solid state elements two-dimensionally arranged on an identical semiconductor substrate so as to correspond to picture cells and each of which includes a photoelectric converting element corresponding to one of the picture cells, and first, second and third field effect transistors such that said photoelectric converting element hs its first electrode connected with the gate electrode of said second field effect transistor, such that the source electrode of said second field effect transistor is connected with the drain electrode of said first field effect transistor, such that the drain electrode of said second field effect transistor is either grounded to the earth or connected with a power supply, such that said third field effect transistor has its drain electrode connected with the gate electrode of said second field effect transistor, and such that the source electrode of said third field effect transistor is either grounded or connected with a power supply; and such that a predetermined number of the gate electrodes of said first field effect transistors are commonly connected to provide a first selection line, such that the source electrodes of said first field effect transistors are commonly connected to provide a second selection line, and such that the gate electrodes of said third field effect transistors are connected with a reset pulse generator.

DESCRIPTION OF THE PREFERRED EMBODIMENTS

First of all, the problems concomitant with the solid state image pickup device having been used heretofore will be described, and the construction of the present invention will then be described.

The present invention relates to a solid state image pickup device to be used in a television camera.

Figure 1:
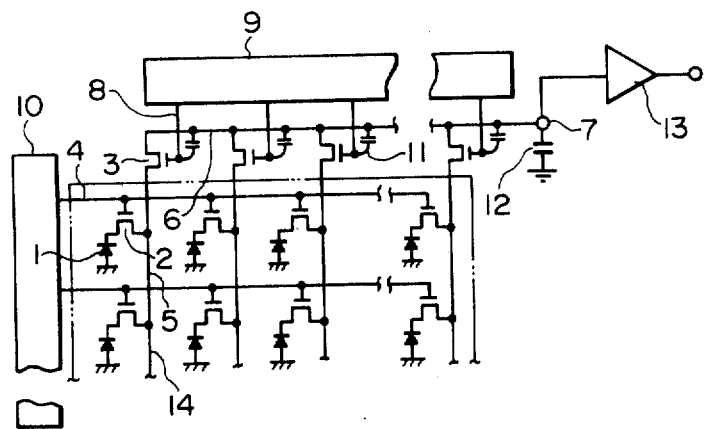
FIG. 1 is a diagram showing a circuit equivalent to a solid state image pickup device according to the prior art.

FIG. 1 is a circuit diagram explaining the typical solid state image pickup device.

A predetermined number of photoelectric converting elements, each of which is constructed of a photodiode 1 and a MOS transistor 2 using the photodiode 1 as its source portion, are arranged to respectively correspond to picture cells, and the photoelectric converting elements, which are arranged in a row vertically of an image pickup frame, are generalized by a signal line 5 and are connected each row with an output terminal 7 through a switching MOS transistor 3 and a signal line 6. There are additionally provided horizontal and vertical scanning circuits 9 and 10, for example, which are constructed of MOS shift registers. The horizontal scanning circuit 9 controls the gates of the MOS transistors 3 through a signal line 8 thereby to perform the horizontal scanning operation. The vertical scanning circuit 10 generalizes and directly controls the gates of the MOS transistors 2 of the respective photoelectric converting elements, which are arranged in a line horizontally of the image pickup frame, for each line thereby to perform the vertical scanning operation. The following description is directed to an n-channel type device using electrons as its signal charge, but a completely similar description can be applied to a p-channel type device using positive holes as its signal charge by inverting the conduction type and the polarity.

The electrons generated by a light are stored in the junction capacitors of the photodiodes 1. Upon the reading operation, the MOS transistors 2 are rendered conductive through the signal lines 4 by the positive scanning pulses which are generated by the vertical scanning circuit 10, and the MOS transistors 3 are consecutively rendered conductive through the signal lines 8 by the positive scanning pulses which are generated by the horizontal scanning circuit 9. Thus, for the time period after the once scanning operation and before the subsequent scanning operation, the charges, which have been converted by the photodiodes 1 from the light incident upon the picture cells and which have been stored in the junction capacitors of the photodiodes 1, are consecutively read out as signal charges.

The solid state image pickup device having been used according to the prior art has failed, as has been described in the above, to be freed from the defects, i.e., (1) the production of the pattern noise in the image picked up, (2) the reduction in the S/N ratio caused by the preamplifier, and (3) the blooming.

Figure 2:
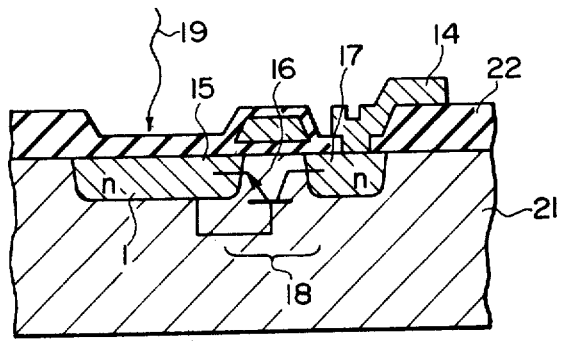
FIG. 2 is a sectional view showing a light receiving portion of the same.

The causes for this blooming will now be explained with reference to FIG. 2 showing the image pickup device in section. FIG. 2 is a sectional view showing the light receiving portion, in which reference numeral 21 indicates a semiconductor substrate; and reference numeral 1 indicates an impurity region forming the photodiode and acting as the source of the MOS transistor. Numerals 17 and 16 indicate a drain and a channel portion, respectively. In case a strong light irradiates the photodiode 1, numerous pairs of electrons and holes are generated to drop the potential at the cathode of the photodiode 1 thereby to render conductive the transverse parasitic transistor 18, which is constructed of the source 15, channel 16 and drain 17 of the MOS transistor 2, so that the electrons are transmitted to a vertical signal line 14 in spite of the fact that the other picture cell is being read out so that said MOS transistor is non-conductive. As a result, even in case the other picture cell connected with the vertical signal line 14 is not irradiated with the light, a false signal caused by the leak of the electrons appears vertically of the image pickup frame.

The noise and blooming phenomenon thus far described raise a severe obstruction against the practice of the solid state image pickup device.

It is, therefore, an object of the present invention to provide a solid state image pickup device which is highly capable of restraining the high S/N ratio and blooming.

Figure 3:
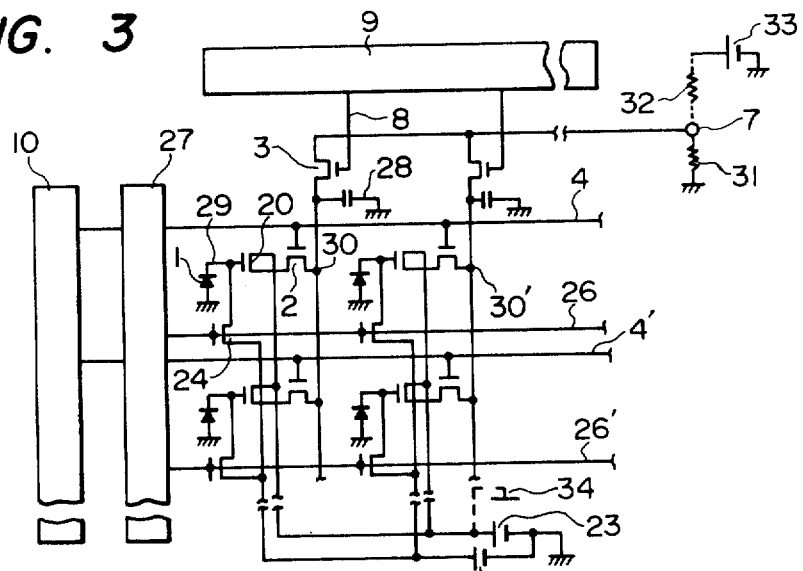
FIG. 3 is a diagram showing an equivalent circuit of an example of a solid state image pickup device according to the present invention.

FIG. 3 is a circuit diagram showing one embodiment of the present invention. The cathode of the photodiode 1 is connected with the gate of an amplifying MOS transistor 20, which has its drain and source connected with a power supply 23 and the source of the transistor 2, respectively. In order to return (or reset) the potential at the cathode of the photodiode after the signal reading operation, on the other hand, there is provided a resetting transistor 24 which has its drain, source and gate connected with the gate of the transistor 20, grounded to the earth or connected with a constant voltage power supply 25 and connected with a reset control line 26, respectively. The scanning circuits 9 and 10 are equivalent to those shown in FIG. 1, and the output of the vertical scanning circuit 10 is connected with the scanning line 4 and the reset control line 26 of each picture cell through a vertical scan control circuit 27. Moreover, reference numeral 28 appearing in FIG. 3 indicates a capacitor of the vertical signal line.

Figure 4:
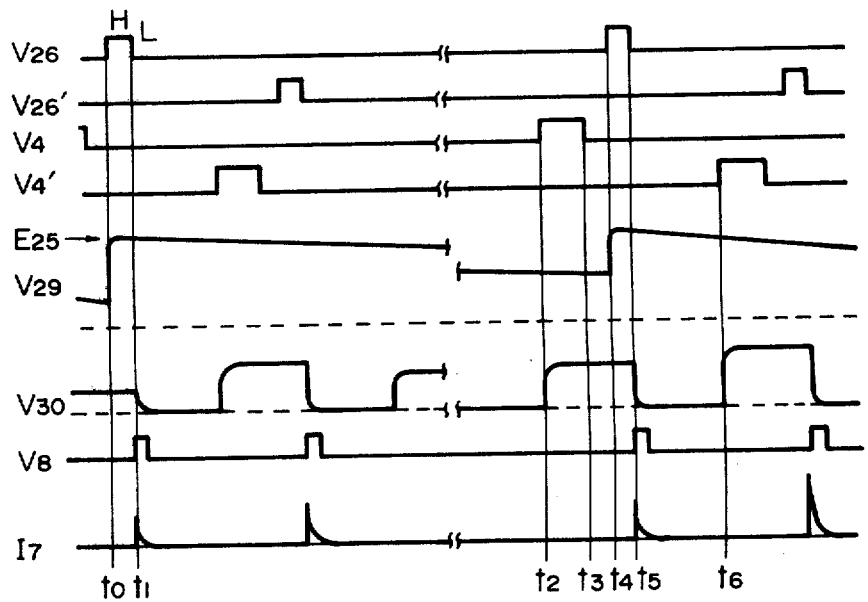
FIG. 4 is a chart illustrating the operating timings of the same device.

FIG. 4 illustrates the operating timing chart of said device. Here, the numerals affixed to the respective voltage and current designate the voltages (V) or the current (I) at the nodes which are indicated by the corresponding numerals in FIG. 3. At a time $t_0$ to $t_1$, the voltage $V_{26}$ takes a high level H so that the clearing transistor 24 is rendered conductive thereby to reset the cathode potential $V_{29}$ of the photodiode 1 to the voltage $E_{25}$ of the power supply 25. When the voltage $V_{26}$ is dropped to a low level L at the time $t_1$, the charges having been stored in the photodiode are released due to the photo current that flows through the photodiode, so that the potential $V_{29}$ is gradually reduced. After a storage time of one field or about 16 ms, the voltage of the scanning line is raised to the high level H, and the source of the amplifying MOS transistor is connected with the vertical signal line so that the voltage thereat varies, as shown, in accordance with the gate voltage $V_{29}$ of the amplifying transistor. If the transistor 20 is operated within its saturation region by making the drain voltage $E_{23}$ thereof higher than the value $(V_{29}-V_{th})$, which is determined by subtracting the threshold voltage $V_{th}$ of said transistor from the voltage $V_{29}$ to be impressed upon the gate of said transistor, the following voltage appears at the voltage $V_{30}$:

$$V_{30} = V_{29} - V_{th} \quad (1)$$

This voltage is obtained as a result that the parasitic capacitor $C_{28}$ (which is indicated at numeral 28 in FIG. 3) of the vertical signal line is charged by the amplifying transistor 20. Thus, the parasitic capacitor $C_{28}$ is charged with the following charges $Q_s$:

$$Q_s = Q_{28} \cdot V_{30} = C_{28}(V_{29} - V_{th}) \quad (2)$$

The operations during the time period $(t_2-t_3)$ are performed during the horizontal erasing period. After that, at a time $t_4$, the voltage $V_{26}$ is raised to the level H, and the photodiode is reset. At a time $t_5$, the scanning pulses from the horizontal scanning circuit take the high level H, as indicated at $V_8$, so that a signal current $I_7$ is read out through a load resistor 31. Here, the current $I_s$ to be obtained as the output is expressed by the following Equation:

$$I_s = Q_s/\tau_r \quad (3)$$

wherein $\tau_r$ designates the period of the horizontal scanning pulses.

Figure 5A:
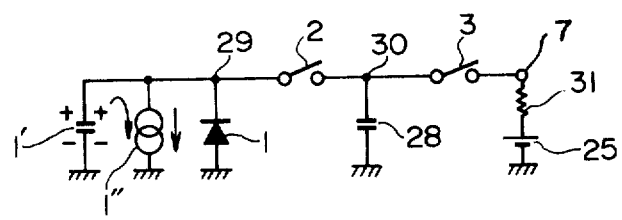
FIGS. 5a and 5b are equivalent circuit diagrams of a signal reading portion but show those of the devices according to the prior art and the present invention, respectively.
Figure 5B:
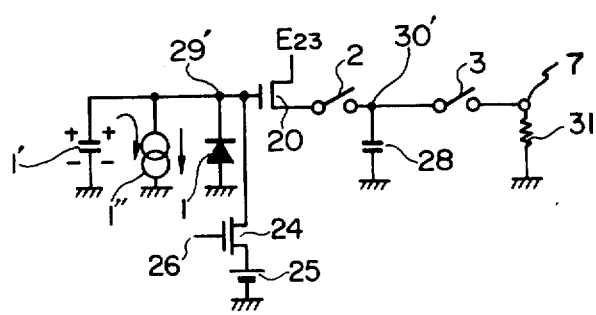

The following description is directed to the fact that the device of the present invention is superior to that of the prior art in the S/N ratio and in the blooming restraining capability. FIGS. 5a and 5b respectively show an equivalent circuit of the signal reading unit of the solid state image pickup device according to the prior art and an equivalent circuit of the signal reading unit of the solid state image pickup device using said amplifier according to the present invention. Here, reference numerals 1' and 1" indicate an equivalent capacitor $C_1'$ of the photodiode and a photocurrent supply $I_{ph}$ which varies with the intensity of the incident light. In either case, the cathode voltages $V_{29}$ and $V_{29}'$ of the photodiode 1 after the signal reading operation become the voltage $E_{25}$ of the bias voltage supply 25, which is stored in the capacitor 1'. In the construction shown in FIG. 5a, the terminals 29 is set at $E_{25}$ simultaneously with the reading operation rendering conductive transistors 2 and 3. The resetting transistor 24 is rendered conductive after the reading operation in the construction shown in FIG. 5b thereby to set the terminals 29 and 29' at $E_{25}$. After that, the charges in the capacitor 1' are released through the photocurrent supply 1" for one field time period $\tau_s$ (which is usually about 17 ms). Both the voltages at the terminals 29 and 29' after the one field time period are expressed by the following Equation:

$$V_{29} = V_{29}' = E_{25} - I_{ph} \cdot \tau_s/C_1' \quad (4)$$

In the case of FIG. 5a, the switching transistor 2 is first rendered conductive to distribute the voltage $V_{29}$ to the vertical signal line capacitor $C_{28}$. The potential at the terminal 30 at that time is expressed by the following Equation:

$$V_{30} = \frac{C_1}{C_1 + C_{28}} (V_{29} - E_{25}) + E_{25} \quad (5)$$

The signal charge to be transferred to the capacitor $C_{28}$ is expressed by the following Equation:

$$C_{30} = C_{28}(V_{30} - E_{25}) \quad (6)$$

$$= -\frac{C_{28} \cdot C_1}{C_{28} + C_1} \cdot \frac{I_{ph} \cdot \tau_s}{C_1}$$

Here, since the capacitances $C_{28}$ and $C_1'$ take about 5 pF and about 0.1 pF, respectively, the Equation (6) can be approximated, as follows:

$$Q_{30} \simeq -I_{ph} \cdot \tau_s \quad (7)$$

In short, the charges stored by the photocurrent supply $I_{pH}$ are transferred as they are to the capacitor 28. These charges are detected as the current flowing through the load resistor 31 or the preamplifier as a result that the horizontal switching transistor is rendered conductive. The signal current $I_7$ takes a spike shape similar to that shown in FIG. 4 and is fed through a low-pass filter so that an average current value $I_7$, in which the signal charge $Q_{30}$ flows on an average for the reading time period, is obtained to provide a video signal. The level of that current is expressed by the following Equation:

$$I_7 = Q_{30}/\tau_r = -I_{ph} \cdot \tau_s/\tau_r \quad (8)$$

In said solid state image pickup device having the built-in amplifier, on the contrary, the voltage to be stored in the capacitor 28 is determined in accordance with the voltage $V_{29}'$, as in the following Equation:

$$V'_{30} = V'_{29} - V_{th} \quad (9)$$

$$= (E_{25} - I_{ph} \cdot \tau_s/C_1) - V_{th}$$

Hence, the charges to be stored in the capacitor 28 are expressed by the following Equation:

$$Q'_{30} = C_{28} \cdot V'_{30}$$

$$= C_{28} \cdot (E_{25} - I_{ph} \cdot \tau_s/C_1 - V_{th})$$

The signal current after having passed through the low-pass filter is expressed by the following Equation:

$$I_7 = \frac{C_{28} \cdot (E_{25} - V_{th})}{\tau_r} \quad (10)$$

$$- C_{28} \cdot I_{ph} \cdot \tau_s/C_1/\tau_r$$

wherein the first term is a portion having no relationship with the optical signal. Hence, the effective signal current $I_{7s}$ is expressed by the following Equation:

$$I_{7s} = -I_{ph} \cdot \tau_s/\tau_r C_{28}/C_1' \quad (11)$$

The signal is increased the $C_{28}/C_1'$ times of the Equation (8) using no amplifier. Since $C_{28} > C_1'$ usually holds, e.g., $C_{28}$ and $C_1'$ take about 5 pF and about 0.1 pF, respectively, said amplifier acquires a gain of about 50 times. As a result, since the signal is 50 times as high as the noise which is produced after the amplification by the switching transistor 3 or the preamplifier, the S/N ratio is improved to a value of 50 times, i.e., about 34 dB so that a device having such a high performance as exceeds not only the solid state image pickup device but also the S/N ratio of the image pickup tube can be realized.

Next, as to the second point of the blooming, even if a strong light comes so that the cathode potential of the photodiode 1 is dropped, the aforementioned transverse parasitic transistor is neither rendered conductive nor does appear the blooming phenomenon, because the photodiode 1 is isolated from the source of the switching transistor 2 by the gate oxide film of the amplifying transistor 20. Incidentally, an example of the concrete construction of the device will be described hereinafter.

Figure 6:
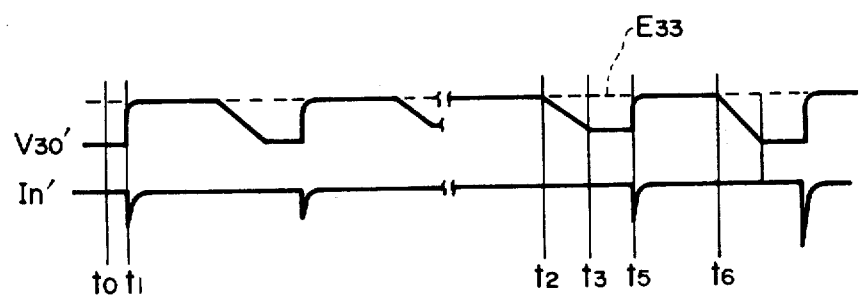
FIG. 6 is a chart illustrating the changes in a potential $V_{30}'$ and an output current $I_7'$.

In said solid state image pickup device, the drain of the amplifying transistor 20 is connected with the power supply 23 but may be grounded to the earth, as indicated at 34 by a broken line in FIG. 3. In this modification, a power supply voltage 33 is supplied, as shown, from the output terminal 7 through a load resistor 32. That power supply voltage is once stored in the capacitor 28 of the vertical signal line simultaneously with the reading operation and is released by the amplifying transistor when the switching transistor 2 is rendered conductive. The potential $V_{30}'$ at a node 30' and the output current $I_7'$ at that time are illustrated in FIG. 6.

Figure 7:
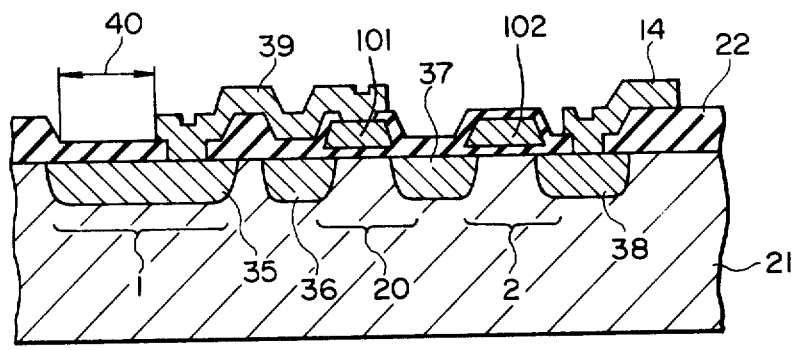
FIGS. 7 and 8 are sectional views respectively showing the solid state image pickup device of the present invention.

FIG. 7 is a sectional view showing an example of the picture cell portion of the solid state image pickup device according to the present invention. In FIG. 7: reference numerals 1, 20 and 2 indicate the portions of the photodiode, the amplifying transistor and the switching transistor, respectively; and reference numerals 35, 36, 37 and 38 indicate the impurity regions providing the souces and drains of the photodiode and the respective transistors, respectively. All of those portions and regions have the conduction type opposite to that of the substrate 21. Numerals 101 and 102 indicate gate electrodes. Although omitted from FIG. 7, the drain of the resetting transistor 24 is connected with the portion 35, and the power supply voltage 23 is connected with the portion 36. On the other hand, numeral 39 indicates a wiring connecting the amplifying transistor 20 and the photodiode 1. In the device thus constructed, the area to be used for the photoelectric conversion in one picture cell is the portion indicated at 40 in FIG. 7.

Figure 8:
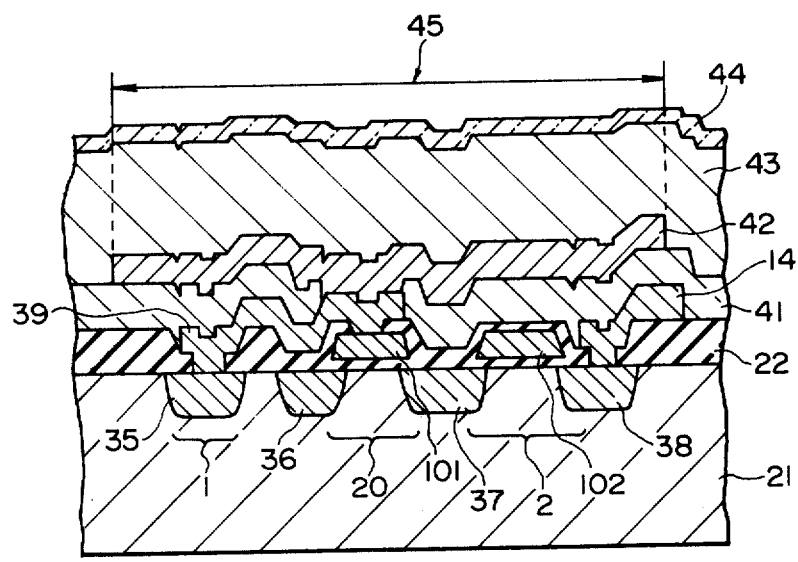

FIG. 8 is a sectional view showing the picture cell according to another embodiment of the present invention.

Figure 9:
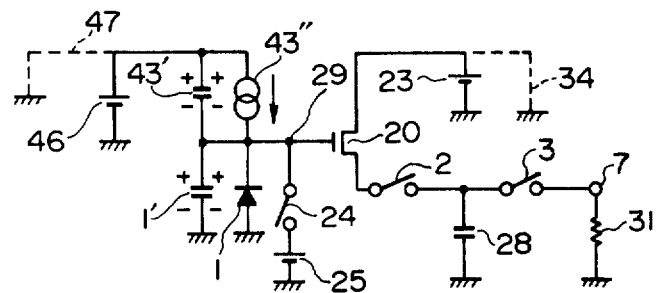
FIGS. 9 and 10 are equivalent circuit diagrams respectively showing the signal reading portion.

The construction of this embodiment is useful for increasing the effective area to be used for the photoelectric conversion of the solid state image pickup device having the built-in amplifier. An example of the solid state image pickup device of this kind is disclosed in Japanese Patent Laid-Open Publication No. 51-10715, for example. It is needless to say that the present invention can also be applied to the solid state image pickup device using a photoconductive film. In this example, there is overlaid on the wiring 39 a metal electrode 42, which is insulated from the underlying circuit except the connecting portion with the wiring 39 by means of an insulator 41 such as $SiO_2$. The construction of the semiconductor substrate portion is similar to the aforementioned example. That metal electrode 42 generally covers one picture cell and is made of metal such as Al, Mo or Ta by the metal evaporation or sputtering process. There is further overlaid on the metal electrode 42 a single- or poly-crystalline or amorphous thin film having photoconductivity. The single-crystalline material may be Si, Ge or HgCdTe; the polycrystalline material may be PbTe, CdSe, ZnCdTe or $In_2Te_3$; and the amorphous material may be amorphous Si, $As_2Se_3$ or Se-As-Te chalcogenide thin film. Although the metal electrode is isolated for each picture cell, it is necessary that even the photoelectric converting film having a resistivity less than $10^{10}$ $\Omega$cm be subjected to that isolation for each picture cell. Even if the other thin films are not subjected to the isolation for each picture cell, as indicated by a photoelectric converting film 43 in FIG. 8, there arises no problem in the transverse flow of the signal. There is overlaid on the photoelectric converting film 43 a transparent electrode which is made of indium oxide containing $SnO_2$ or Sn. As a result, the effective area to be used for the photoelectric conversion substantially occupies one picture cell, as indicated at 45, so that a higher sensitivity than that of FIG. 7 can be attained. Moreover, since the amplifier portion is shielded with the metal electrode 42 and the photoelectric converting film 43, no charge due to the photoelectric conversion is generated at the portions 35 to 38 so that a stable operation can be realized. The equivalent circuit for the signal reading operation at this time is shown in FIG. 9. Of the reference numerals, the same numerals as those of FIG. 5 indicate the same elements. In FIG. 9, reference numerals 43' and 43" indicate the equivalent capacitor $C_{43}'$ of the photoelectric converting film and the photocurrent supply $I_{ph}$, respectively. On the other hand, numeral 46 indicates a bias power supply which is to be impressed upon the photoelectric converting film 43 through a transparent electrode 44 and which may be grounded to the earth, as indicated at 47. In the case of the present device, the potential at the terminal 29 after the storage of one frame is expressed by the following Equation:

$$V_{29} = E_{25} + \frac{I_{ph} \cdot \tau_s}{C_1 + C_{43}}. \tag{12}$$

That potential is expressed by the following Equation in case the transparent electrode is grounded to the earth, as indicated at 47:

$$V_{29} = E_{25} - \frac{I_{ph} \cdot \tau_s}{C_1 + C_{43}}. \tag{13}$$

The signal reading operations of the device thus far described are not different from those of the case of FIG. 4 in the least.

Figure 10:
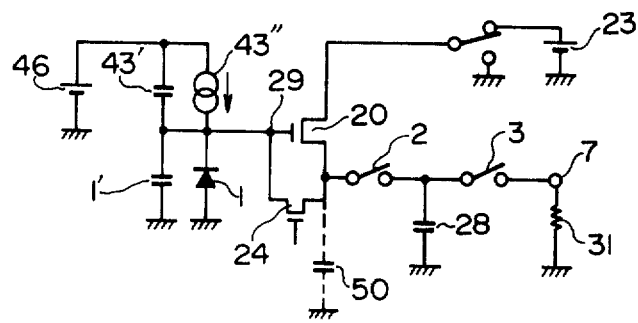
Figure 11:
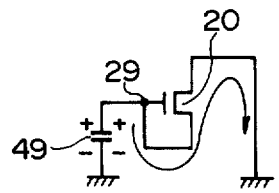
FIG. 11 is a diagram showing an equivalent circuit to an amplifying transistor when it is reset.
Figure 12:
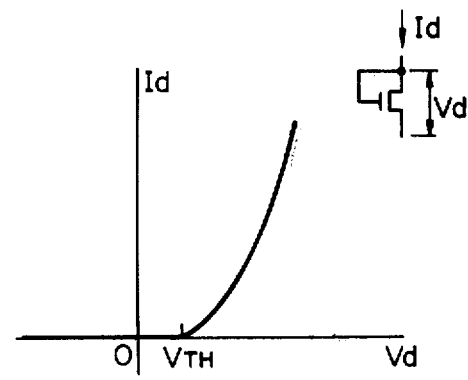
FIG. 12 is a graphical presentation showing the relationship between the drain voltage—current of the amplifying transistor.

In the solid state image pickup device of this kind, a better image can be obtained by constructing the signal reading circuit of the device, as shown in FIG. 10. Here, the resetting transistor 24 is so connected that it can short-circuit the gate and source of the amplifying tranistor 20. In FIG. 10, the same reference numerals as those in FIG. 9 indicate the same elements. On the other hand, the voltage to be impressed upon the drain of the transistor 20 is so switched that it is supplied to the voltage $E_{23}$ when in the amplifying operation and is grounded to the earth when in the resetting operation. The circuit under consideration is characterized in that the potential at the node 29 after the resetting operation becomes the threshold voltage $V_{th}$ of the amplifying transistor 20. This will be described with reference to FIG. 11 showing the equivalent circuit when in the resetting operation. A capacitor 49 is composed by connecting the capacitors 43' and 1' of FIG. 10 in parallel. The capacitor 49 is discharged by the amplifying transistor 20 which has its source and gate short-circuited. The relationship between the drain current $I_d$ of the MOS transistor thus connected and a voltage $V_d$ is made, as shown in FIG. 12, such that the drain current $I_d$ flows only when the drain voltage $V_d$ exceeds the threshold voltage $V_{th}$. The drain current exhibits such square characteristics as are expressed by the following Equation:

$$I_d = \beta(V_d - V_{th})^2 \tag{14}$$

wherein $\beta$ is such a coefficient as is determined by the mobility of carriers, the capacitance of the gate oxide film and so on. Because of these I-V characteristics, no current flows to cease the discharge when the voltage at 29 of the circuit of FIG. 11 reaches the threshold voltage $V_{th}$. In other words, the voltage at the node 29 is reset at the threshold voltage $V_{th}$ of the amplifying MOS transistor 20 itself. Reverting to the circuit of FIG. 10, the description will be continued. After the resetting operation, the carriers generated by the light are stored in the capacitors $C_{43}'$ and $C_1'$, and the potential at that point is expressed similarly to the Equation (2), as follows:

$$V_{29} = V_{th} + \frac{I_{ph} \cdot \tau_s}{C_1' + C_{43}'} \tag{15}$$

Hence, the voltage to be stored in the capacitor $C_{28}$ is expressed by the following Equation:

$$V_{30} = \frac{I_{ph} \cdot \tau_s}{C_1' + C_{43}'} \tag{16}$$

And, the output current $I_7'$ is expressed by the following Equation:

$$I_7 = -\frac{C_{28}}{C_1' + C_{43}'} \cdot \frac{\tau_s}{\tau_r} \cdot I_{ph} \tag{17}$$

As will be understood from this Equation, the output current $I_7'$ is free from the influence of the threshold voltage $V_{th}$.

Figure 13:
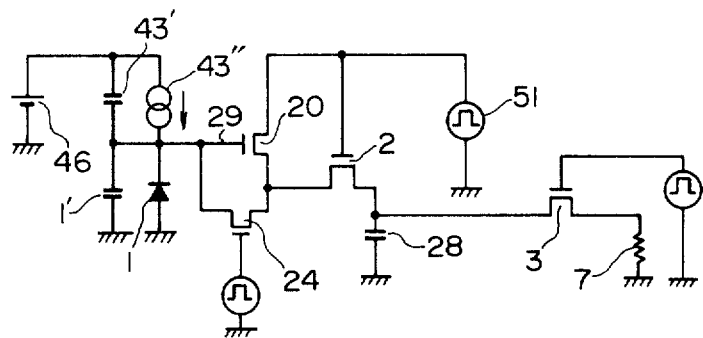
FIGS. 13, 14 and 15 are equivalent circuit diagrams respectively showing the major portions of the solid state image pickup device of the present invention.

In the circuit shown in FIG. 10, the timing for the amplification is coincident with that for turning on the switch 2. Hence, as shown in FIG. 13, if the drain of the transistor 20 is connected with the gate of the transistor 20 and further with the power pulse voltage 51 which is used to act as both the power supply voltage and the scanning voltage, the number of the wirings is so reduced as to highly contribute to the improvement in the integration.

Figure 14:
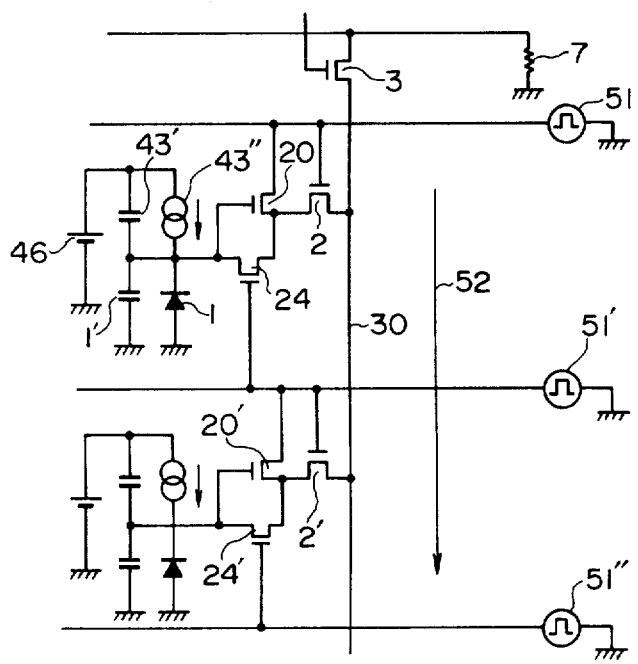

Moreover, there is a case, in which the resetting operation of the picture cells belonging to the horizontal scanning line having been previously read can be performed simultaneously with the amplification of the picture cells belonging to one horizontal scanning line, e.g., the case of the image pickup device in which the interlaced scanning is not performed. In this case, as shown in FIG. 14, the resetting transistor 24 of the already read picture cell can be rendered conductive by the power supply pulses 51' to be supplied to an amplifier 20'. Here, reference numeral 52 indicates the vertical scanning direction. As a result, the number of the wirings can be reduced to a remarkable extent.

Figure 15:
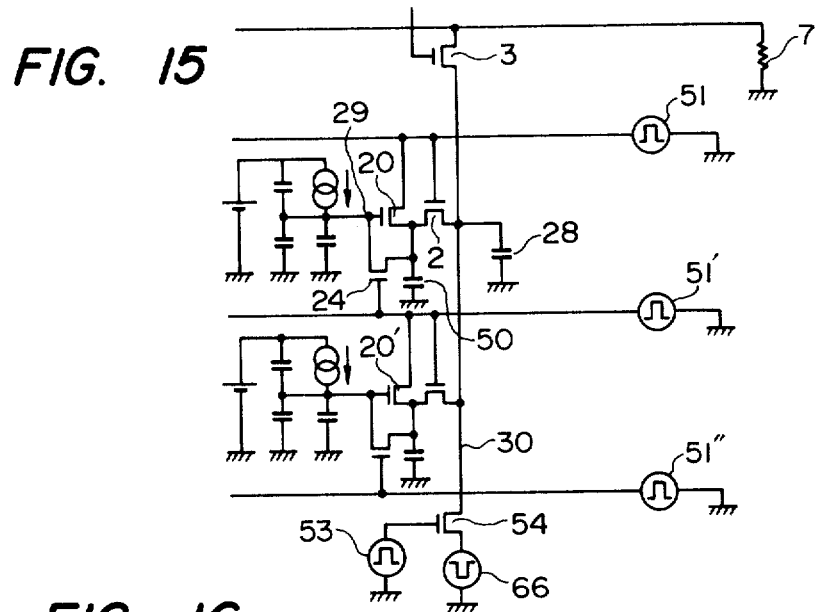
Figure 16:
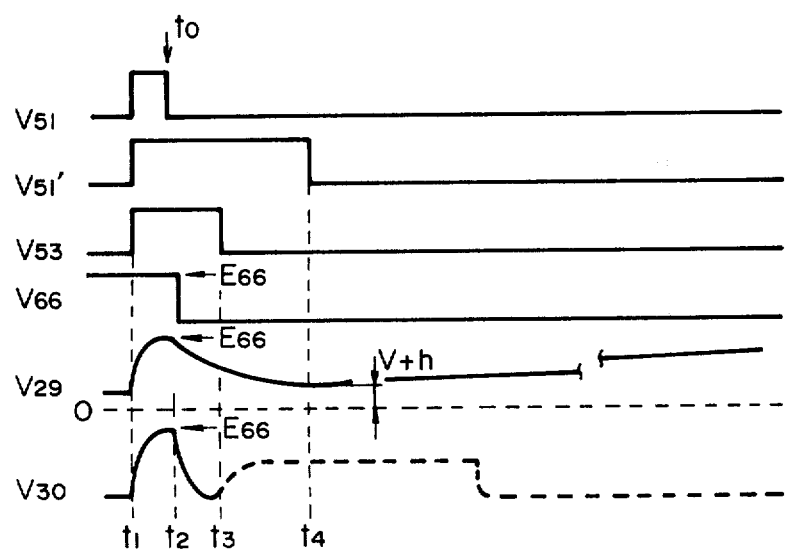
FIG. 16 is a chart illustrating the operating timings of the device, the equivalent circuit of which is shown in FIG. 15.

In case the resetting operation is to be performed in the circuit structure shown in FIG. 10, the potential at the node 29 has to be equal to or higher than the threshold voltage $V_{th}$ before the resetting operation. Incidentally, in case the present circuit is assembled in an IC substrate, there exists a parasitic capacitor $C_{50}$ which is indicated at 50 in FIG. 10. Since the drain of the amplifying transistor 20 is grounded to the earth before the resetting operation and since the voltage $V_{29}$ at the gate is equal to or higher than the threshold voltage, the transistor 20 is rendered conductive to discharge the capacitor $C_{50}$. At the time when the resetting operation is started, the capacitors $C_1'$, $C_{43}'$ and $C_{50}$ are connected so that those charges are distributed among those three parallel capacitors. However, since no charge exists in the capacitor $C_{50}$, there arises a fear that the potential at $V_{29}$ becomes equal to or lower than the threshold voltage $V_{th}$. As shown in FIG. 15, therefore, a presetting transistor 54 is made to have its drain, source and gate connected with the vertical signal line 30, a presetting pulse power supply 66 and a preset pulse generator 53. FIG. 16 is a chart illustrating the operating timings of the present circuit. First of all, during the time period $t_1$ to $t_2$, the transistors 2, 54 and 24 are rendered conductive to set the potential $V_{29}$ of the capacitor $C_{29}$ and at the node 29 at the voltage $E_{66}$ of the preset voltage supply. After that, for the subsequent horizontal reading operation, it becomes necessary to release the charges of the vertical signal line 30 in advance. For this necessity, during the time period $t_2$ to $t_3$, the voltage of the preset power supply 66 is dropped to a zero volt thereby to discharge the capacitor $C_{28}$. After that, the potential at 53 is dropped to render the transistor 54 non-conductive. During the time period $t_3$ to $t_4$, the capacitor 28 is charged with the signal charge by the amplifying transistor 20'. Incidentally, the resetting operation of the node 29 is simultaneously performed during the time period $t_0$ to $t_4$.

Figure 17:
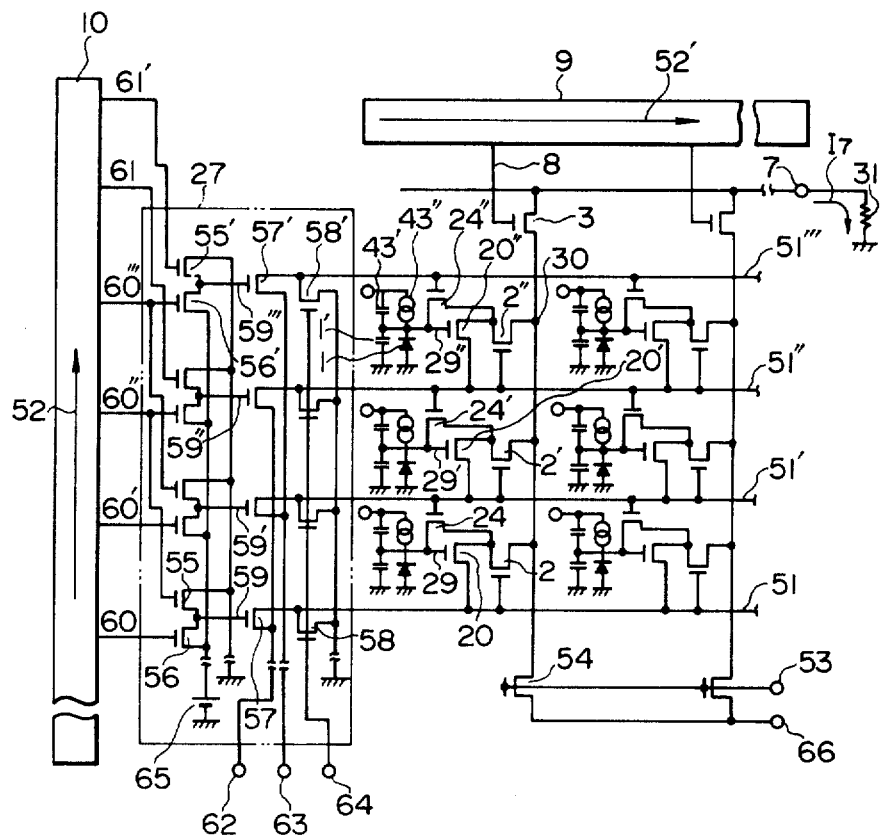
FIGS. 17 and 21 are diagrams respectively showing the equivalent circuits of the solid state image pickup device of the present invention.
Figure 18:
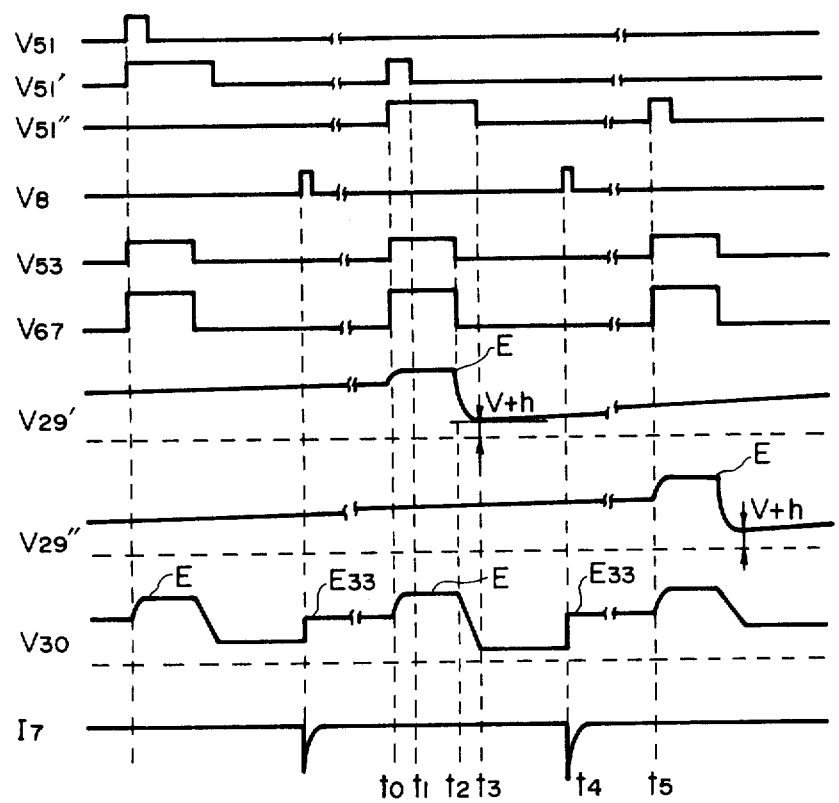
FIGS. 18 to 20 are charts illustrating the operations of the solid state image pickup device.
Figure 19:
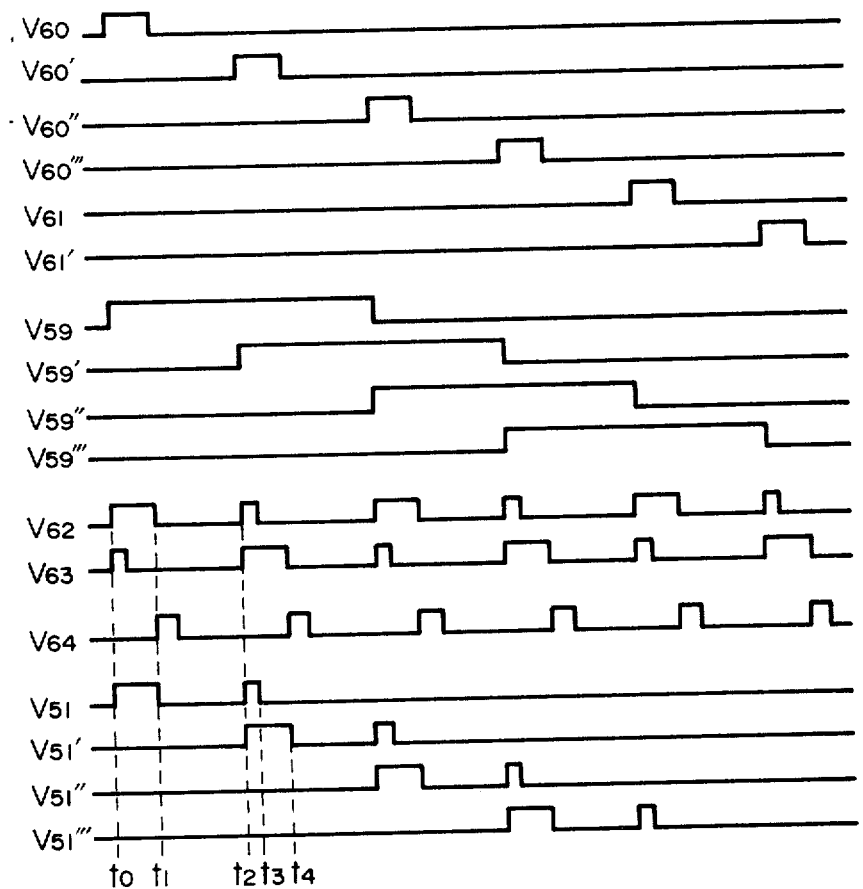
Figure 20:
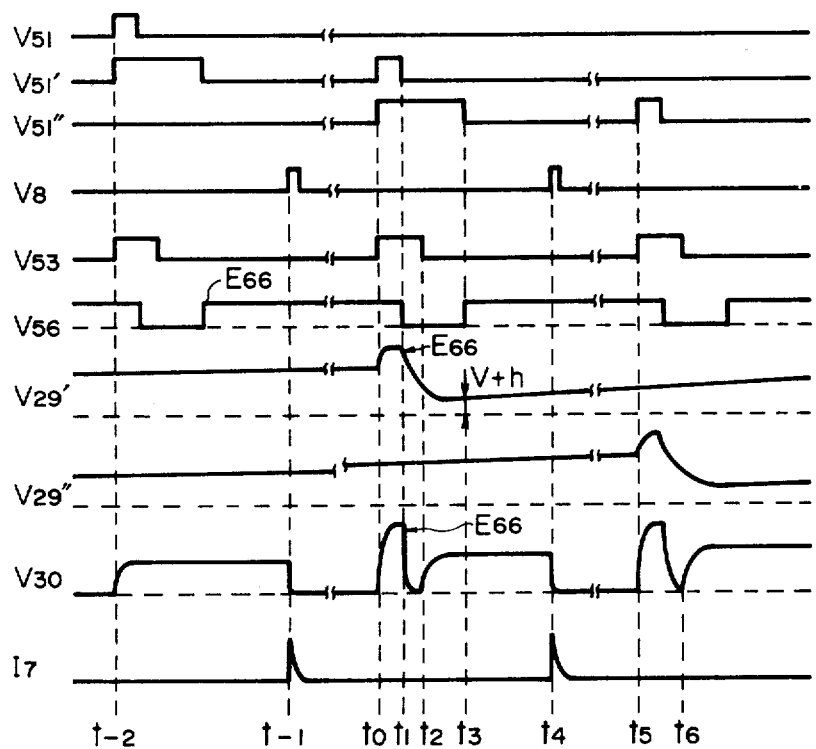
Figure 21:
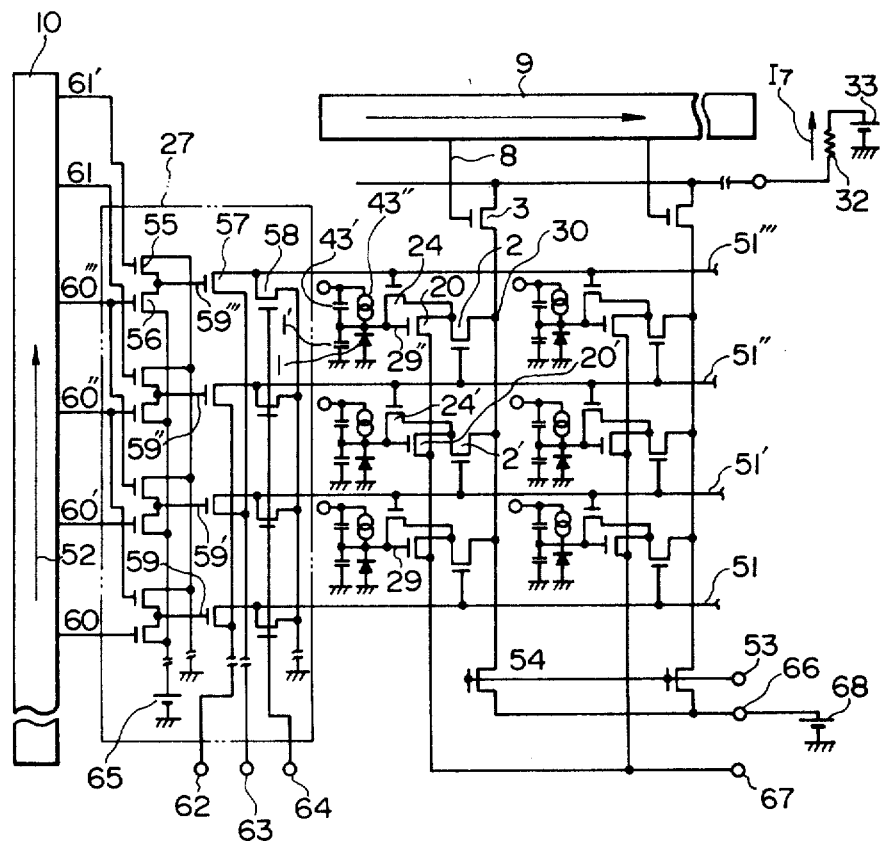

Examples of the whole circuit construction of the solid state image pickup device considering the detailed description thus far made are shown in FIGS. 17 and 21. The elements indicated at the same reference numerals as those used in the foregoing description are the same as those having already been described. The circuit enclosed by broken lines 27 indicate the vertical scanning control circuit, and the control of one scanning line is effected by four MOS transistors 55, 56, 57 and 58. The other circuit-constructing elements are the same as those having already been described. The operations of the present circuit will be described with reference to FIG. 18 first from the operations of the vertical scanning control circuit 27. First of all, the vertical scanning circuit is scanned in the direction 52, as viewed from the drawing, to consecutively generate the scanning pulses at such timings at output terminals 60 to 60''', 61 and 61' as are illustrated in FIG. 19. When the voltage at the point 60 takes the H level (which is sufficient to render a MOS transistor conductive), the transistor 56 is rendered conductive so that a voltage 65 is impressed upon the gate of the transistor 57 thereby to render the same transistor conductive. The conducting state of the transistor 57 continues until the scanning circuit output 60" takes the H level thereby to ground the gate of the transistor 57 to the earth. This behavior is illustrated at $V_{59}$ in FIG. 19. After that, the voltages indicated at $V_{59}'$ to $V_{59}'''$ are generated with an overlapped half period even at other points 59' to 59'''. If the drain of the transistor at the conducting state is supplied with the pulses indicated at $V_{62}$ and $V_{63}$ from 62 or 63, the scanning and resetting pulses indicated at $V_{51}$ to $V_{51}'''$ are generated at the scanning lines 51 to 51'''. Next, the internal operations of the solid state image pickup device to be controlled by the scanning pulses thus far described will be described with reference to FIG. 20. First of all, when the scanning line 51' takes the H level, the amplifying and switching transistors 20' and 2' connected therewith operate to feed out the voltage to the vertical signal line 30 in accordance with the voltage at the node 29'. This behavior is illustrated at the time $t_{-2}$ of the voltage $V_{30}$. At the time $t_{-1}$ the pulses indicated at $V_8$ are generated from the horizontal scanning pulses so that the potential at the node 30 is read out and dropped, as indicated at $V_{30}$. At the time $t_0$, the scanning lines 51' and 51'' simultaneously take the H level together with the preset control pulses $V_{53}$ so that the terminal 29 is preset at the voltage $E_{66}$ of the terminal 66 through the vertical signal line 30. At the time $t_1$, the scanning line 51' is dropped to the L level so that the node 29' is reset at the threshold voltage $V_{th}$ of the transistor 20' by the transistor 20' having its gate and drain short-circuited by a transistor 24'. After that, at the time $t_1$, the voltage $V_{66}$ is released to the earth so that the voltage of the vertical scanning line is dropped to a level about the zero volt, as indicated at $V_{30}$. After that, during the time period $t_2$ to $t_3$, an amplifying transistor 20'' belonging to the subsequent scanning line 51'' is operated to generate the voltage on the vertical scanning line. These operations are subsequently repeated to effect the scanning operations of all the picture cells.

The fundamental structure of the present example is shown in section in FIG. 8 so that its fabricating steps will be shortly described with reference to the same Figure. On principle, it is sufficient to apply the usual method of fabricating a semiconductor device. A $SiO_2$ film to be used as the gate insulating film is formed on the p-type silicon substrate 21 by the usual CVD process. Then, there are formed the respective gate portions (101, 102 and so on) of polysilicon and the impurity regions (35, 36, 37, 38 and so on). On these gate portions and impurity regions, there is further formed another $SiO_2$ film. This film is etched to form the electrode leading openings for the respective impurity regions. The $SiO_2$ insulating film 41 is formed after the electrodes (30, 14 and so on) have been formed. After that, in a manner to correspond to the gate portions or the like of the transistor connected wit the photodiode 1, the $SiO_2$ insulating film 41 is formed with an opening, in which the metal electrode 42 is provided. This electrode 42 is overlaid by the photoelectric converting film 43. This photoelectric converting film is made of an amorphous film of Se-As-Te chalcogenide having a thickness of 4 μm (which may be naturally replaced by an amorphous silicon film or the like) by the heating evaporation process. Finally, the transparent electrode of indium oxide containing Sn is formed to have a thickness of about 30 nm by the sputtering process, thus finishing the fundamental portion. Incidentally, one picture cell is sized to be 40×40 μm², and the n-channel MOS transistor has the minimum channel length of 5 μm.

FIG. 21 is a whole circuit diagram of another embodiment, which is identical to that of FIG. 17 except that the sources of the amplifying transistors 20 are commonly connected with a terminal 67 and that the voltage 33 is impressed upon the output terminal 7 through the load resistor 32. The major difference of the present circuit from that shown in FIG. 17 resides in that the circuit of FIG. 17 charges the vertical signal line 30 with the voltage in accordance with the potential at the terminal 29 whereas the present circuit drops the potential of the signal line 30 from $E_{33}$ by the discharge in accordance with the voltage at the terminal 29. The operations of the circuit of FIG. 20 are illustrated in FIG. 18. As shown, the voltage $V_{30}$ is dropped during the time period $t_2$ to $t_3$ by the amplification and is returned to $E_{33}$ each time it is read out at the time $t_4$ by the horizontal switch 3. On the other hand, the output current is inverted from that of the foregoing circuit of FIG. 17, as indicated at $I_7$ in FIG. 18.

Figure 22:
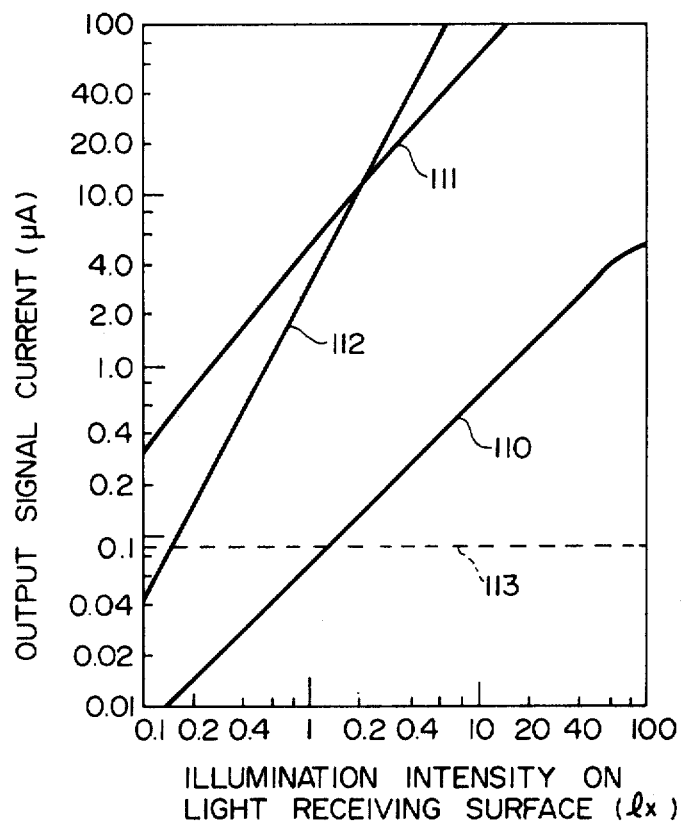
FIG. 22 is a graphical presentation illustrating the characteristics of an output signal current.

FIG. 22 illustrates the output signal current characteristics of the device thus fabricated. In FIG. 22: a curve 110 indicates the characteristics of the device having its circuit construction shown in FIG. 1; a curve 111 indicates those of the device of the present invention shown in FIG. 17; and a curve 112 indicates those of the device of the present invention shown in FIG. 21. For the incident light having an intensity of 1 lux, the device having the characteristics of the curve 111 can produce an output about 70 times as high as those of the prior art, and the device having the characteristics of the curve 112 can produce an output about 40 times as high as those of the prior art. Moreover, the noise chracteristics indicate a low value of about 0.008 nA for all illumination intensity, as indicated at a flat line 113 in FIG. 22 (wherein the level of the [noise] is plotted ten times), so that a remarkably high S/N ratio can be attained.

What is claimed is:

1. A solid state image pickup device comprising a plurality of solid state elements two-dimensionally arranged on a semiconductor substrate, each of said solid state elements forming a picture cell of the solid state image pick-up device and including a photoelectric converting element coupled to a first switching field effect transistor, said first field effect transistor being coupled to selection lines for enabling scanning of the picture cells, each of said photoelectric converting elements being indirectly connected to the associated first field effect transistor through a second amplifying field effect transistor, and means coupled to said photoelectric converting elements for resetting said photoelectric converting elements.

2. A solid state image pickup device as set forth in claim 1, wherein said resetting means comprises a third field effect transistor associated with each of said solid state elements, said photoelectric converting element having a first electrode connected with the gate electrode of said second field effect transistor, said second field effect transistor having the source electrode connected with the drain electrode of said first field effect transistor, the drain electrode of said second field effect transistor being connected with a predetermined potential, said third field effect transistor having the drain electrode connected with the gate electrode of said second field effect transistor and the source electrode of said third field effect transistor being connected with a predetermined potential, a predetermined number of gate electrodes of said first field effect transistors being commonly connected to provide one of said selection lines, the source electrode of a predetermined number of said first field effect transistors being commonly connected to provide another of said selection lines, and the gate electrodes of said third field effect transistors being connected with a reset pulse generator.

3. A solid state image pickup device as set forth in claim 2, wherein said photoelectric converting element is formed of an impurity region which is provided in said semiconductor substrate and which has an opposite conduction type to that of said semiconductor substrate.

4. A solid state image pickup device as set forth in claim 2, wherein said photoelectric converting element includes an electrode formed in said semiconductor substrate, a photoconductive layer overlaid on said electrode, and a transparent electrode overlaid on said photoconductive layer.

5. A solid state image pickup device as set forth in claim 2, wherein said predetermined potential to which the drain electrode of said second field effect transistor is connected is one of a ground potential and a potential provided by a power supply, said predetermined potential to which the source electrode of said third field effect transistor is connected is one of a ground potential and a potential provided by a power supply.

6. A solid state image pickup device as set forth in claim 2, 3 or 4, wherein the gate electrode of said first field effect transistor is connected with the drain electrode of said second field effect transistor.

7. A solid state image pickup device as set forth in claim 2, 3, or 4, wherein the gate electrode of said third field effect transistor of one of said solid state elements is connected with the gate electrode of said first field effect transistor of another of said solid state elements which is to be subsequently scanned.

8. A solid state image pickup device as set forth in claim 2, 3, or 4, wherein the drain and source electrodes of said third field effect transistor are connected with the drain and gate electrodes of said second field effect transistor, respectively.

9. A solid state image pickup device as set forth in claim 6, wherein the gate electrode of said third field effect transistor of one of said solid state elements is connected with the gate electrode of said first field effect transistor of another of said solid state elements which is to be subsequently scanned.

10. A solid state image pickup device as set forth in claim 6, wherein the drain and source electrodes of said third field effect transistor are connected with the drain and gate electrodes of said second field effect transistor, respectively.

* * * * *